(12) United States Patent
Okubo

(10) Patent No.: US 10,461,659 B2
(45) Date of Patent: Oct. 29, 2019

(54) SEMICONDUCTOR DEVICE AND POWER CONVERTING DEVICE

(71) Applicant: SHINDENGEN ELECTRIC MANUFACTURING CO., LTD., Chiyoda-ku (JP)

(72) Inventor: Teiichi Okubo, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 0 days.

(21) Appl. No.: 15/774,154

(22) PCT Filed: Oct. 10, 2017

(86) PCT No.: PCT/JP2017/036576
§ 371 (c)(1),
(2) Date: May 7, 2018

(87) PCT Pub. No.: WO2019/073506
PCT Pub. Date: Apr. 18, 2019

(65) Prior Publication Data
US 2019/0252997 A1 Aug. 15, 2019

(51) Int. Cl.
*H02M 7/44* (2006.01)
*H02M 7/12* (2006.01)
(52) U.S. Cl.
CPC .................. *H02M 7/125* (2013.01)
(58) Field of Classification Search
CPC ............ H02M 7/42; H02M 7/44; H02M 7/53; H02M 7/537; H02M 7/003; H01L 23/49;
(Continued)

(56) References Cited

U.S. PATENT DOCUMENTS 8,461,623 B2 * 6/2013 Nakata .................. H01L 25/072
257/146
2010/0134979 A1 6/2010 Obiraki et al.
(Continued)

FOREIGN PATENT DOCUMENTS

JP 2004-273749 A 9/2004
JP 2007-60733 A 3/2007
(Continued)

OTHER PUBLICATIONS

Netherlands Office Action dated Nov. 20, 2018 in Netherlands Patent Application No. 2020851 (with partial English translation), 14 pages.
(Continued)

*Primary Examiner* — Gary L Laxton
(74) *Attorney, Agent, or Firm* — Oblon, McClelland, Maier & Neustadt, L.L.P.

(57) ABSTRACT

A semiconductor device includes a module substrate, a first input wiring line disposed on a top surface of the module substrate and including a first portion extending along a first side of the module substrate and a second portion extending along a second side that is adjacent to the first side, the second portion having one end that is connected to one end of the first portion, a first input terminal disposed on another end of the second portion and electrically connected to the first input wiring line, first to fourth transistors, first and second output terminals, a second input wiring line disposed on the top surface of the module substrate so as to be close to a fourth side that is opposite to the first side and adjacent to the second side, a second input terminal, and a module sealing member sealing the top surface.

14 Claims, 6 Drawing Sheets

(58) Field of Classification Search
CPC ......... H01L 23/52; H01L 23/50; H01L 25/07; H01L 25/11
See application file for complete search history.

(56) References Cited

U.S. PATENT DOCUMENTS

| | | |
|---|---|---|
| 2011/0291236 A1 | 12/2011 | Hayashi et al. |
| 2012/0307541 A1* | 12/2012 | Shimoike ............... H01L 24/29 363/132 |
| 2015/0023081 A1 | 1/2015 | Obiraki et al. |
| 2015/0171764 A1* | 6/2015 | Ujita .................... H02M 7/003 363/132 |

FOREIGN PATENT DOCUMENTS

| | | |
|---|---|---|
| JP | 2011-238906 A | 11/2011 |
| JP | 2016-144365 A | 8/2016 |
| JP | 2017-5043 A | 1/2017 |
| JP | 2017-11305 A | 1/2017 |
| JP | 2017-17911 A | 1/2017 |
| JP | 2017-103392 A | 6/2017 |

OTHER PUBLICATIONS

International Search Report dated Jan. 16, 2018, in PCT/JP2017/036576 filed Oct. 10, 2017.

* cited by examiner

SEMICONDUCTOR DEVICE AND POWER CONVERTING DEVICE

TECHNICAL FIELD

The present invention relates to a semiconductor device and a power converting device.

BACKGROUND ART

Conventional generators used as mobile generators include a generator in which an AC voltage is generated by an alternator driven by an engine, the generated AC voltage is converted to a DC voltage through rectification by a rectifying circuit and smoothing by an electrolytic capacitor, and the converted DC voltage is converted to an AC voltage by a semiconductor device (module).

In such a generator, a power converting device in which electronic components including the semiconductor device are housed in a housing case and are resin-sealed may be used.

Examples of such a power converting device include one in which imbalance in electric current flowing through the electronic components is curbed in consideration of margins in thermal design (for example, see JP 2017-17911 A), and another in which downsizing of the semiconductor device is sought in consideration of damage or detachment of terminal caused by load stress (for example, see JP 2017-5043 A).

However, the downsizing of the semiconductor device is not sought in full consideration of the current path passing through input and output of the semiconductor device that converts power in the conventional power converting device.

DISCLOSURE OF THE INVENTION

Problem to be Solved by the Invention

Under the circumstance, the object of the present invention is to provide a downsized semiconductor device in which the current path passing through input and output is optimized.

Solution to Problem

A power converting device according to an embodiment in an aspect of the present invention is a semiconductor device configured to convert an inputted voltage and output a converted voltage, including:

a module substrate;

a first input wiring line disposed on a top surface of the module substrate and including a first portion that extends along a first side of the module substrate and a second portion that extends along a second side, which is adjacent to the first side, the second portion having one end that is connected to one end of the first portion;

a first input terminal disposed on another end of the second portion and electrically connected to the first input wiring line;

a first transistor disposed on the first portion so as to be on a side of the one end of the first portion;

a second transistor disposed on the first portion so as to be on a side of another end of the first portion;

a first power wiring line disposed in a first substrate region that is closer to a central region of the top surface of the module substrate than the first input wiring line, the first power wiring line being adjacent to the one end of the first portion and the second portion of the first input wiring line;

a second power wiring line disposed in a second substrate region that is closer to the central region on the top surface of the module substrate than the first input wiring line, the second power wiring line being adjacent to the first substrate region on a side of a third side that is opposite to the second side;

a third transistor disposed on the first power wiring line;

a fourth transistor disposed on the second power wiring line;

a first output terminal disposed on the first power wiring line and electrically connected to the first power wiring line;

a second output terminal disposed on the second power wiring line and electrically connected to the second power wiring line;

a second input wiring line disposed on the top surface of the module substrate so as to be close to a fourth side that is opposite to the first side and adjacent to the second side of the module substrate;

a second input terminal disposed on the second input wiring line and electrically connected to the second input wiring line; and a module sealing member configured to seal the top surface of the module substrate.

The semiconductor device may further include:

a first control wiring line disposed on the top surface of the module substrate, and having one end that is connected to a control electrode of the first transistor;

a second control wiring line disposed on the top surface of the module substrate, and having one end that is connected to a control electrode of the second transistor;

a first control terminal disposed on another end of the first control wiring line so as to be closer to the second side than the first transistor, and electrically connected to the first control wiring line; and a second control terminal disposed on another end of the second control wiring line so as to be closer to the third side than the second transistor, and electrically connected to the second control wiring line.

The semiconductor device may further include:

a third control wiring line disposed on the top surface of the module substrate, and having one end that is connected to a control electrode of the third transistor;

a fourth control wiring line disposed on the top surface of the module substrate, and having one end that is connected to a control electrode of the fourth transistor;

a third control terminal disposed on another end of the third control wiring line so as to be closer to the second side than the third transistor, and electrically connected to the third control wiring line; and a fourth control terminal disposed on another end of the fourth control wiring line so as to be closer to the third side than the fourth transistor, and electrically connected to the fourth control wiring line.

In the semiconductor device, the other end of the second portion of the first input wiring line is close to an intersection of the second side and the fourth side of the module substrate.

In the semiconductor device, the first output terminal and the second output terminal are arranged to be close to each other in a direction along the first side.

In the semiconductor device, the first control terminal and the third control terminal are arranged along the second portion of the first input wiring line, and the second control terminal and the fourth control terminal are arranged along the third side of the module substrate.

In the semiconductor device,
a width of the first portion of the first input wiring line is greater than a width of the second portion of the first input wiring line.

In the semiconductor device,
a width of the first input wiring line of the module substrate is greater than a width of a wiring line of a wiring board that is disposed above the module substrate.

In the semiconductor device,
the second input wiring line is disposed to be close to a central portion of the fourth side of the module substrate.

In the semiconductor device,
the first input wiring line has an L shape.

In the semiconductor device,
the first transistor is a first high-side transistor having a drain that is electrically connected to the first input wiring line, a source that is electrically connected to the first power wiring line, and a gate, which is a control electrode, electrically connected to the first control wiring line,
the second transistor is a second high-side transistor having a drain that is electrically connected to the first input wiring line, a source that is electrically connected to the second power wiring line, and a gate, which is a control electrode, electrically connected to the second control wiring line,
the third transistor is a first low-side transistor having a drain that is electrically connected to the first power wiring line, a source that is electrically connected to the second input wiring line, and a gate, which is a control electrode, electrically connected to the third control wiring line, and
the fourth transistor is a second low-side transistor having a drain that is electrically connected to the second power wiring line, a source that is electrically connected to the second input wiring line, and a gate, which is a control electrode, electrically connected to the fourth control wiring line.

The semiconductor device may further include:
a module casing surrounding the module substrate.

In the semiconductor device,
a direction along which the first portion of the first input wiring line extends is perpendicular to a direction along which the second portion extends.

The semiconductor device may further include:
a third power wiring line disposed on the top surface of the module substrate to be adjacent to the second input wiring line on a side of the second side of the module substrate,
a fourth power wiring line disposed on the top surface of the module substrate to be adjacent to the second input wiring line on a side of the third side of the module substrate,
a first resistor electrically connecting the second input wiring line and the third power wiring line, and
a second resistor electrically connecting the second input wiring line and the fourth power wiring line,
wherein the source of the third transistor is electrically connected to the second input wiring line via the third power wiring line and the first resistor, and
wherein the source of the fourth transistor is electrically connected to the second input wiring line via the fourth power wiring line and the second resistor.

A power converting device according to an embodiment in an aspect of the present invention is a power converting device configured to convert an input voltage and output a converted output voltage, including:

a housing case having a first surface and a second surface that is opposite to the first surface;
a wiring board disposed in the housing case, and having a third surface that faces the first surface of the housing case and a fourth surface that is opposite to the third surface;
a rectification module disposed in a first case region on the first surface of the housing case, electrically connected to the wiring board, and rectifying the input voltage to output a rectified voltage;
a semiconductor device disposed in a second case region on the first surface of the housing case so as to be adjacent to the rectification module, electrically connected to the wiring board, and converting the rectified voltage that is rectified by the rectification module to output a converted voltage;
a reactor disposed in a third region on the first surface of the housing case so as to be adjacent to the semiconductor device, electrically connected to the wiring board, and adjusting the converted voltage outputted from the semiconductor device to output an adjusted voltage;
a control unit disposed on the fourth surface of the wiring board, and controlling operations of the rectification module and the semiconductor device;
a smoothing capacitor disposed on the fourth surface of the wiring board, connected to an output of the rectification module via a wiring line of the wiring board, and smoothing the rectified voltage outputted from the rectification module;
a noise filter disposed on the fourth surface of the wiring board, connected to an output of an LC filter including the reactor via a wiring line of the wiring board, and filtering a voltage outputted from the LC filter to output a filtered voltage; and
a first sealing member sealing the rectification module, the semiconductor device, and the reactor on the first surface of the housing case, and also sealing the wiring board and the control unit, the smoothing capacitor, and the noise filter on the fourth surface of the wiring board,
wherein the semiconductor device includes:
a module substrate;
a first input wiring line disposed on a top surface of the module substrate and including a first portion that extends along a first side of the module substrate and a second portion that extends along a second side, which is adjacent to the first side, the second portion having one end that is connected to one end of the first portion;
a first input terminal disposed on another end of the second portion and electrically connected to the first input wiring line;
a first transistor disposed on the first portion so as to be on a side of the one end of the first portion;
a second transistor disposed on the first portion so as to be on a side of another end of the first portion;
a first power wiring line disposed in a first substrate region that is closer to a central region of the top surface of the module substrate than the first input wiring line, the first power wiring line being adjacent to the one end of the first portion and the second portion of the first input wiring line;
a second power wiring line disposed in a second substrate region that is closer to the central region on the top surface of the module substrate than the first input wiring line, the second power wiring line being adjacent to the first substrate region on a side of a third side that is opposite to the second side;
a third transistor disposed on the first power wiring line;
a fourth transistor disposed on the second power wiring line;

a first output terminal disposed on the first power wiring line and electrically connected to the first power wiring line;

a second output terminal disposed on the second power wiring line and electrically connected to the second power wiring line;

a second input wiring line disposed on the top surface of the module substrate so as to be close to a fourth side that is opposite to the first side and adjacent to the second side of the module substrate;

a second input terminal disposed on the second input wiring line and electrically connected to the second input wiring line; and a module sealing member configured to seal the top surface of the module substrate.

Effects of the Invention

A semiconductor device according to an aspect of the present invention is a semiconductor device configured to convert an inputted voltage and output a converted voltage, including:

a module substrate;

a first input wiring line disposed on a top surface of the module substrate and including a first portion that extends along a first side of the module substrate and a second portion that extends along a second side, which is adjacent to the first side, the second portion having one end that is connected to one end of the first portion;

a first input terminal disposed on another end of the second portion and electrically connected to the first input wiring line;

a first transistor disposed on the first portion so as to be on a side of the one end of the first portion;

a second transistor disposed on the first portion so as to be on a side of another end of the first portion;

a first power wiring line disposed in a first substrate region that is closer to a central region of the top surface of the module substrate than the first input wiring line, the first power wiring line being adjacent to the one end of the first portion and the second portion of the first input wiring line;

a second power wiring line disposed in a second substrate region that is closer to the central region on the top surface of the module substrate than the first input wiring line, the second power wiring line being adjacent to the first substrate region on a side of a third side that is opposite to the second side;

a third transistor ML1 disposed on the first power wiring line;

a fourth transistor disposed on the second power wiring line;

a first output terminal disposed on the first power wiring line and electrically connected to the first power wiring line;

a second output terminal disposed on the second power wiring line and electrically connected to the second power wiring line;

a second input wiring line disposed on the top surface of the module substrate so as to be close to a fourth side that is opposite to the first side and adjacent to the second side of the module substrate;

a second input terminal disposed on the second input wiring line and electrically connected to the second input wiring line; and a module sealing member configured to seal the top surface of the module substrate.

Thus, in the semiconductor device according to the present invention, the first to fourth transistors are arranged to be close to one another, and the first input wiring line has an L shape including the first portion that is along the first side of the module substrate and the second portion that is along the second side J2, the first input terminal and the second input terminal are arranged on one side of the module substrate, and the first output terminal and the second output terminal are arranged to be in the central region on the surface of the module substrate.

This enables the reduction in size of the semiconductor device according to the present invention while the current path for input and output is optimized.

EMBODIMENTS FOR CARRYING OUT THE INVENTION

Embodiments of the present invention will now be described with reference to the accompanying drawings.

Embodiments

Figure 1:
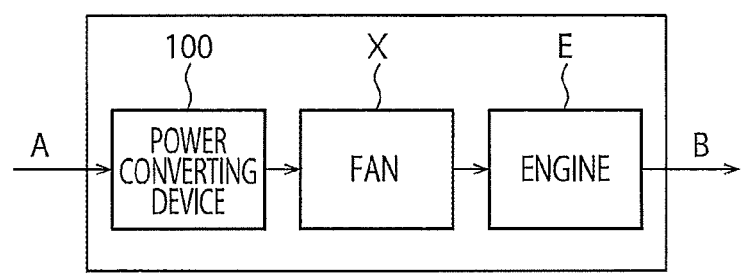
FIG. 1 is a diagram illustrating an example of a configuration of a power generating system 1000 in which a power converting device 100 according to an embodiment is used.

A power generating system 1000 includes, for example, an engine E, a fan X driven by an alternator (not shown) connected to the engine E, and a power converting device 100 that outputs an AC voltage (output voltage VOUT) obtained by converting an AC voltage (input voltage VIN) outputted from the alternator, as shown in FIG. 1, for example.

In the power generating system 1000, when the fan X is driven, an airflow A, which is a cooling airflow, flows into the power generating system 1000 from outside and is guided to an area around the power converting device 100 and the engine E. The power converting device 100 and the engine E are cooled by the airflow A, which is the cooling airflow, and heat generated by the power converting device 100 and the engine E is released outside with an airflow B.

Figure 2:
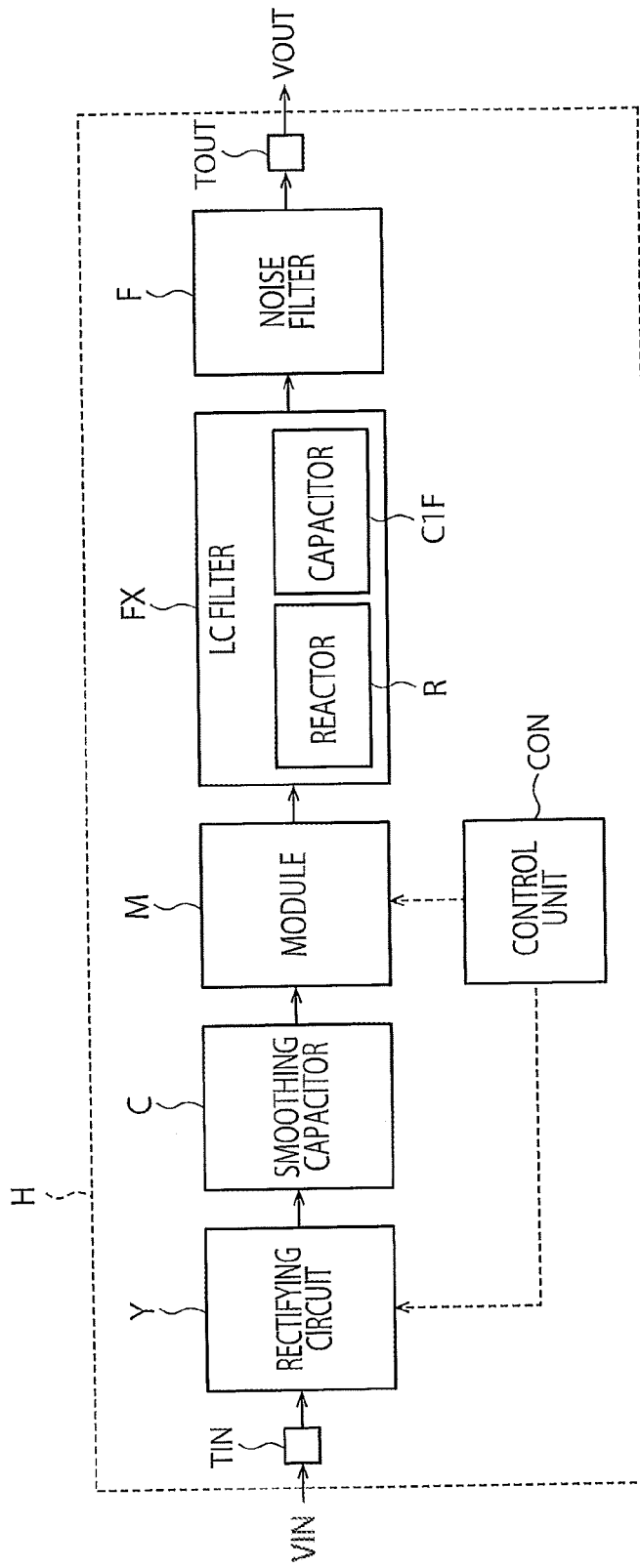
FIG. 2 is a block diagram illustrating an example of a main configuration of the power converting device 100 according to the embodiment shown in FIG. 1.
Figure 3:
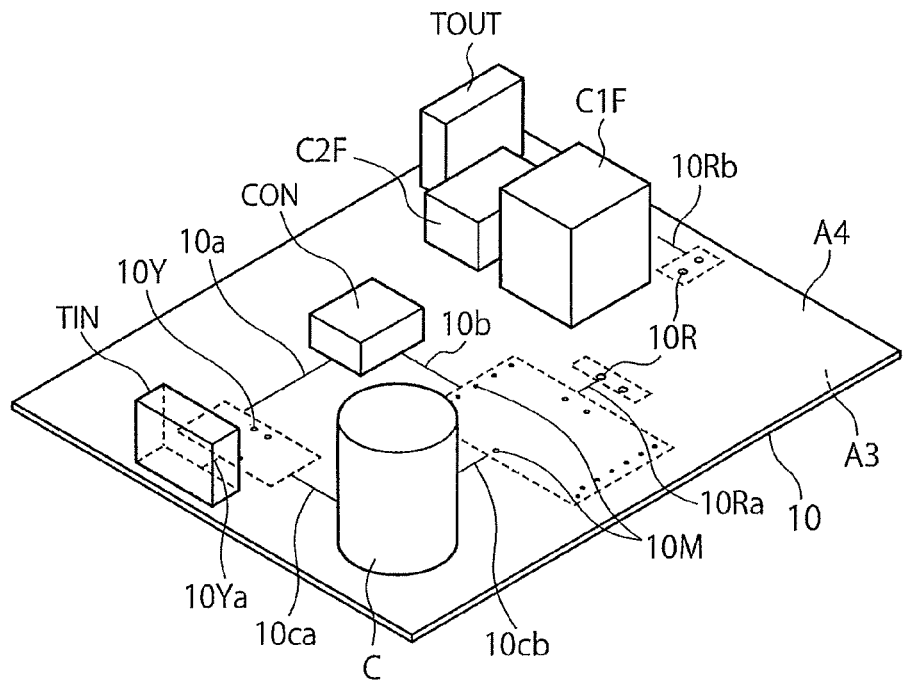
FIG. 3 is a top view illustrating an example of the external appearance of the power converting device 100 shown in FIG. 2.
Figure 4:
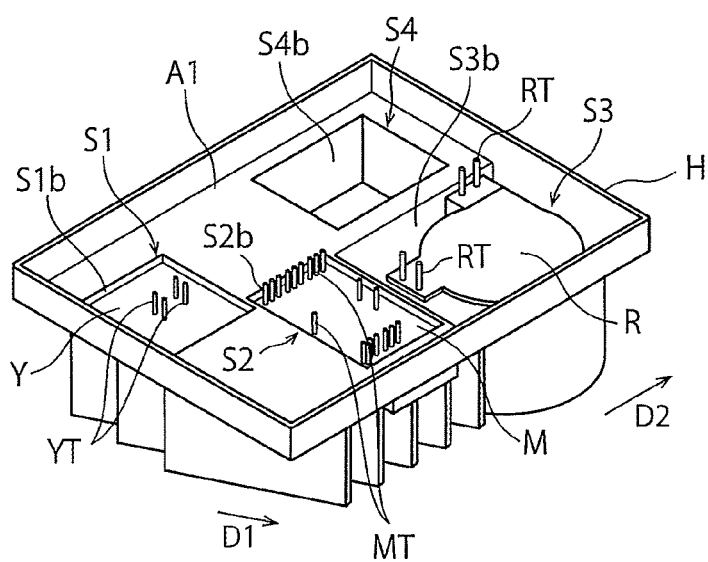
FIG. 4 is a perspective view illustrating a housing case H shown in FIG. 3 before being sealed, including first to third electronic components Y, M, and R.

As shown in FIGS. 2 to 4, for example, the power converting device 100 includes a housing case H, a heat radiation fin Z, a first sealing member 11, a wiring board 10, an input terminal TIN, an output terminal TOUT, a first electronic component (rectification module) Y, a second electronic component (semiconductor device) M, an LC filter (third electronic component (reactor) R, capacitor CIF) LC, a smoothing capacitor C, a noise filter F, and a control unit CON. FIG. 2 only shows components required for the power converting device 100 to convert an input voltage VIN to an output terminal TOUT, and leaves out the other components. FIG. 3 shows the state where the electronic components and the wiring board 10 of the power converting device 100 are sealed by the first sealing member 11. The noise filter F includes a capacitor C2F and a fourth electronic component W.

Figure 5:
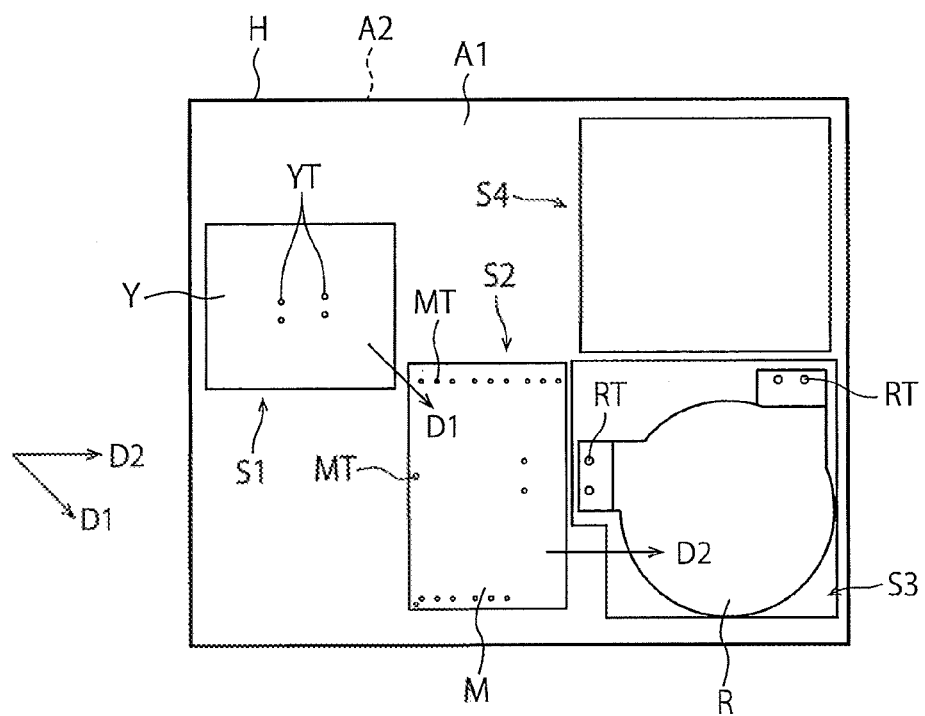
FIG. 5 is a top view illustrating an example of the housing case H shown in FIG. 4 before being resin-sealed, including the first to third electronic components Y, M, and R.

As shown in FIGS. 4 and 5, for example, the housing case H has a first surface (top surface) A1, which is an inner surface (on which the electronic components are mounted) and a second surface A2 (lower surface, outer surface) which is disposed to be opposite to the first surface A1.

The housing case H and the heat radiation fin Z are integrally formed of aluminum, for example.

The first electronic component Y is disposed in a first case region S1 on the first surface A1 of the housing case H, as shown in FIGS. 4 and 5, for example. The first electronic component Y is a first heat source that generates heat during operation.

As shown in FIG. 2, for example, the first electronic component Y is a rectifying circuit (rectification module) electrically connected to the wiring board 10, controlled by the control unit CON, and rectifying an input voltage (AC voltage) VIN to output a rectified voltage.

The first electronic component Y is molded (sealed) by a second sealing member (sealing resin) that is different from the first sealing member 11. Thus, the rectification module Y includes a second sealing member that is different from the first sealing member 11, and the circuit portion of the rectification module Y is sealed by the second sealing member.

Figure 6:
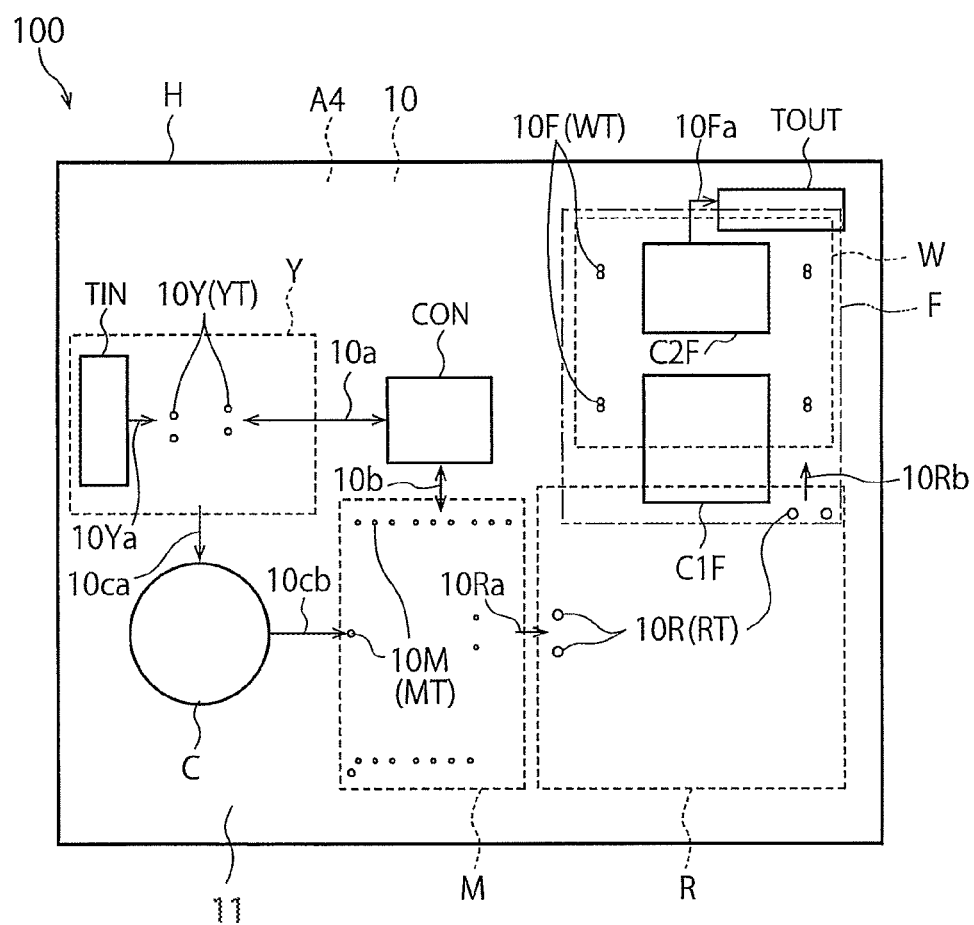
FIG. 6 is a top view illustrating an example of a wiring board 10 shown in FIG. 3.

As shown in FIGS. 4 and 5, for example, the first electronic component Y has a plurality of terminals YT for inputting or outputting the input voltage VIN, the rectified voltage, and a control signal. The terminals YT are electrically connected to electrodes 10Y of the wiring board 10 by soldering, for example (FIGS. 3 and 6).

Thus, the first electronic component (rectification module) Y is electrically connected to the wiring board 10. In particular, the input (terminals YT for input, electrode 10Y) of the rectification module Y is connected to the input terminal TIN via a wiring line 10Ya of the wiring board 10, and the output (terminals YT for output, electrode 10Y) of the rectification module Y is connected to the smoothing capacitor C via a wiring line 10Ca of the wiring board 10 (FIG. 3).

As shown in FIGS. 4 and 5, for example, the first case region S1 of the first surface A1 in which the first electronic component Y is disposed is a first recessed portion S1b formed as a recession in the first surface A1 of the housing case H.

The second electronic component M is arranged in a second case region S2 of the first surface A1 of the housing case H to be adjacent to the first electronic component Y along a first direction D1, as shown in FIGS. 4 and 5, for example. The second electronic component M is a second heat source that generates heat during operation.

The second electronic component M is, for example, a semiconductor device (bridge circuit) electrically connected to the wiring board 10, and controlled by the control unit CON to convert the rectified voltage from the rectifying circuit (first electronic component) Y and to output a converted voltage, as shown in FIG. 2.

The second electronic component M is molded (sealed) by a third sealing member (sealing resin) that is different from the first sealing member 11. Thus, the semiconductor device M includes a third sealing member (module sealing member) that is different from the first sealing member 11, and the circuit portion of the semiconductor device M is sealed by the third sealing member (module sealing member).

As shown in FIGS. 4 and 5, for example, the second electronic component M has a plurality of terminals MT for inputting or outputting the rectified voltage, the AC voltage, and the control signal. The terminals MT are electrically connected to electrodes 10M of the wiring board 10 by soldering, for example (FIGS. 3 and 6).

Thus, the second electronic component (semiconductor device) M is electrically connected to the wiring board 10. In particular, the input (terminals MT for input, electrode 10M) of the semiconductor device M is connected to the output (terminals YT for output, electrode 10Y) of the rectification module Y via the wiring line 10Ca and a wiring line 10Cb of the wiring board 10, and the output (terminals MT for output, electrode 10M) of the semiconductor device M is connected to the input (terminals RT for input, electrode 10R of the reactor R via a wiring line 10Ra of the wiring board 10 (FIG. 3).

The amount of heat generated in a unit time during the operation of the second electronic component (semiconductor device) M is greater than the amount of heat generated in the unit time during the operation of the first electronic component (rectification module) Y.

As shown in FIGS. 4 and 5, for example, the second case region S2 of the first surface A1 in which the second electronic component M is disposed is a second recessed portion S2b formed as a recession in the first surface A1 of the housing case H.

The third electronic component R is arranged in a third region S3 of the first surface A1 of the housing case H to be adjacent to the second electronic component (semiconductor device) M along a second direction D2, as shown in FIGS. 4 and 5, for example. The third electronic component R is a third heat source that generates heat during operation.

The third electronic component R is, for example, a reactor electrically connected to the wiring board 10, adjusting (by removing a high-frequency component) the voltage outputted from the semiconductor device M, and outputting an adjusted voltage, as shown in FIG. 2.

As shown in FIGS. 4 and 5, the third electronic component R has a plurality of terminals RT, to which the voltage outputted from the semiconductor device M is inputted, and from which the adjusted voltage is outputted. The terminals RT are electrically connected to the electrode 10R of the wiring board 10 by soldering, for example (FIGS. 3 and 6).

Thus, the third electronic component (reactor) R is electrically connected to the wiring board 10. In particular, the input (terminals RT for input, electrode 10R) of the reactor R is connected to the output of the semiconductor device M via the wiring line 10Ra of the wiring board 10, and the output (terminals RT for output, electrode 10R) of the reactor R is connected to the input of the noise filter F via a wiring line 10Rb of the wiring board 10 and a capacitor C1F disposed on a fourth surface A4 of the wiring board 10 (FIG. 3).

The amount of heat generated in the unit time during the operation of the third electronic component (reactor) R is smaller than the amount of heat generated in the unit time by the first electronic component (rectification module) Y and the second electronic component (semiconductor device) M.

As shown in FIGS. 4 and 5, for example, the third region S3 of the first surface A1 in which the third electronic component R is disposed is a third recessed portion S3b formed as a recession in the first surface A1 of the housing case H.

The fourth electronic component W is arranged in a fourth region S4 on the first surface A1 of the housing case H to be adjacent to the third electronic component R as shown in FIGS. 4 and 5. The fourth electronic component W is a winding forming the noise filter F.

As shown in FIGS. 4 and 5, for example, the fourth region S4 of the first surface A1 in which the fourth electronic component W is disposed is a fourth recessed portion S4b formed as a recession in the first surface A1 of the housing case H.

As described above, the first to fourth electronic components Y, M, R, and W are arranged along the perimeter of the first surface (inner surface) A1, which has a substantially rectangular shape, of the housing case H (namely along the current path in which a current flows).

The space for housing the first to fourth electronic components Y, M, R, and W in the housing case H may be reduced in this manner. This in turn leads to the reduction in size of the power converting device 100.

The wiring board 10 is disposed in the housing case H, as shown in FIG. 3. The wiring board 10 has a third surface A3 (lower surface) that faces the first surface A1 of the housing case H, and the fourth surface A4 (top surface) that is opposite to the third surface A3.

The wiring board 10 includes the wiring lines 10Ya, 10Ca, 10Cb, 10Ra, 10Rb, 10Fa, 10a, and 10b, and the electrodes 10Y, 10M, 10R, and 10F.

The input terminal TIN is disposed on the fourth surface A4 of the wiring board 10, as shown in FIGS. 3 and 6, for example. The input terminal TIN is connected to the input of the rectification module (first electronic component Y) via the wiring line of the wiring board 10.

A portion of the input terminal TIN connecting to the wiring board 10 is sealed by the first sealing member 11. The input voltage VIN is supplied to the input terminal TIN.

As shown in FIG. 3, the input terminal TIN is electrically connected to the electrode 10Y via the wiring line 10Ya of the wiring board 10.

The smoothing capacitor C is disposed on the fourth surface A4 of the wiring board 10, as shown in FIGS. 3 and 6, for example.

In particular, the smoothing capacitor C is disposed on the fourth surface A4 of the wiring board 10 so as to be above an area that is adjacent to the rectification module Y (first case region S1) and adjacent to the semiconductor device M (second case region S2) on a side opposite to the reactor R (third region S3) in the second direction D2, as shown in FIGS. 3 and 4.

The smoothing capacitor C is connected to the output (terminals YT for output, electrode 10Y) of the rectification module (first electronic component) Y via the wiring line 10Ca of the wiring board 10.

A portion the smoothing capacitor C connecting to the wiring board 10 is sealed by the first sealing member 11, as shown in FIGS. 3 and 6, for example. The smoothing capacitor C smooths the voltage outputted from the rectification module (first electronic component) Y.

As shown in FIG. 3, for example, the smoothing capacitor C is electrically connected to the electrode 10Y via the wiring line 10Ca of the wiring board 10. The smoothing capacitor C is also electrically connected to the electrode 10M via the wiring line 10Cb of the wiring board 10, as shown in, for example, FIG. 3. Thus, the smoothing capacitor C is connected to the Input (terminals MT for input, electrode 10M) of the semiconductor device M via the wiring line 10Cb of the wiring board 10.

As shown in FIG. 3, for example, the capacitor C2F of the noise filter F is disposed on the fourth surface A4 of the wiring board 10. The noise filter F is configured to filter the voltage outputted from the LC filter FX including the third electronic component (reactor) R and the capacitor C1F, and outputs the filtered voltage to the output terminal TOUT.

The input of the noise filter F is connected to the output of the reactor R via the wiring line 10Rb of the wiring board 10 and the capacitor C1F, as shown in FIG. 3, for example. The output of the noise filter F is electrically connected to the output terminal TOUT via the wiring line 10Fa of the wiring board 10.

The capacitor CF2 of the noise filter F is disposed on the fourth surface A4 of the wiring board 10, connected to the output (terminals RT for output, electrode 10R) of the reactor R via the wiring line 10Rb of the wiring board 10, filters the voltage outputted from the LC filter FX, and outputs the filtered voltage.

The output terminal TOUT is disposed on the fourth surface (top surface) A4 of the wiring board 10, as shown in FIGS. 3 and 6, for example. The output terminal TOUT is connected to the wiring board 10. The first sealing member 11 seals the connection portion between the output terminal TOUT and the wiring board 10.

The output terminal TOUT outputs the voltage supplied from the noise filter F as the output voltage VOUT.

As shown in FIG. 3, the control unit CON is disposed on the fourth surface A4 of the wiring board 10. The control unit CON controls operations of the first electronic component (rectification module) Y and the second electronic component (semiconductor device) M, as shown in FIG. 2, for example.

The control unit CON controls the operation of the first electronic component (rectification module) Y by inputting and outputting a control signal to be inputted to the first electronic component Y via the wiring line 10a of the wiring board 10 and the electrode 10Y shown in FIG. 3.

The control unit CON also controls the operation of the second electronic component (semiconductor device) M by inputting and outputting a control signal to be inputted to the second electronic component M via the wiring line 10b of the wiring board 10 and the electrode 10M shown in FIG. 3.

The first sealing member 11 seals the first to fourth electronic components Y, M, R, and W on the first surface A1 of the housing case H, as shown in FIG. 3.

The first sealing member 11 also seals the wiring board 10 and the control unit CON, a portion of the input terminal TIN, a portion of the smoothing capacitor C, a portion of the capacitor C2F of the noise filter F, and a portion of the output terminal TOUT on the fourth surface A4 of the wiring board 10.

The first sealing member 11 is formed of a sealing resin such as an epoxy resin.

The heat radiation fin Z is disposed on the second surface (outer surface) A2 of the housing case H, as shown in FIG. 4, for example.

Example 1

Figure 7:
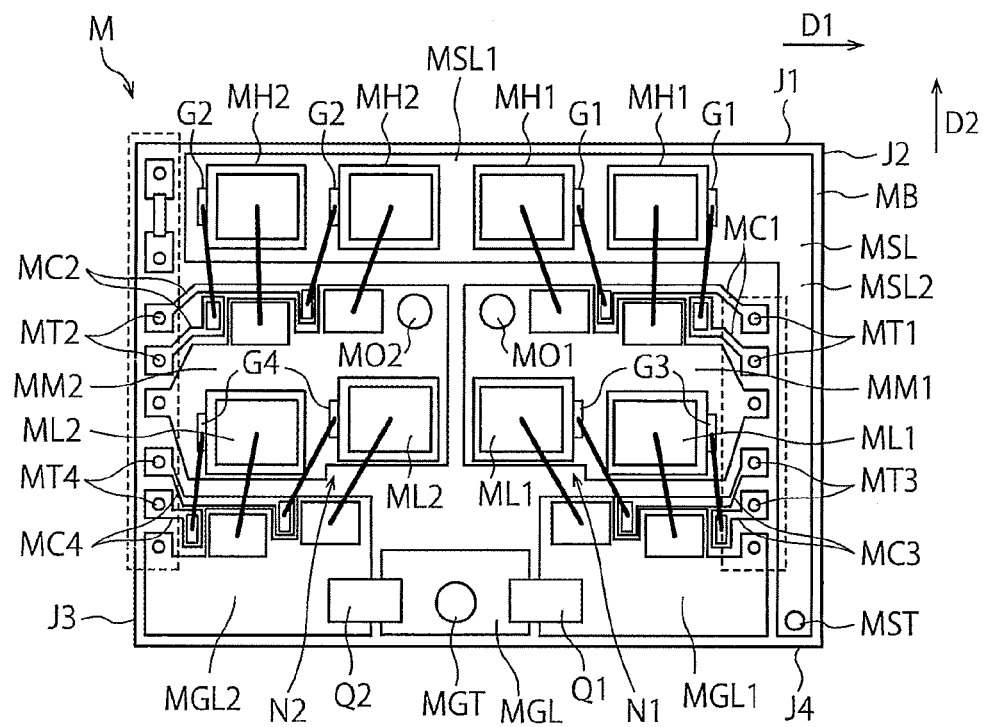
FIG. 7 is a top view illustrating an example of a configuration of a semiconductor device M.

A specific example of a configuration of the semiconductor device M used in the power converting device 100 will be described below. FIG. 7 is a top view illustrating an example of the configuration of the semiconductor device M before being sealed.

As described above, the semiconductor device M converts a voltage inputted through the first input terminal (power supply terminal) MST and the second input terminal (ground terminal) MGT, and outputs the converted voltage via the first output terminal MO1 and the second output terminal MO2.

As shown in FIG. 7, for example, the semiconductor device M Includes a module substrate MB, a first input wiring line (power supply wiring line) MSL, a first input terminal (power supply terminal) MST, a second Input wiring line (ground wiring line) MGL, a second input terminal (ground terminal) MGT, a first output terminal MO1, a second output terminal MO2, a first transistor (high-side transistor) MH1, a second transistor (high-side transistor) MH2, a third transistor (low-side transistor) ML1, a fourth transistor (low-side transistor) ML2, a first power wiring line MM1, a second power wiring line MM2, a third power wiring line MGL1, a fourth power wiring line MGL2, a first control wiring line MC1, a second control wiring line MC2, a third control wiring line MC3, a fourth control wiring line MC4, a first control terminal MT1, a second control terminal MT2, a third control terminal MT3, a fourth control terminal MT4, a first resistor Q1, and a second resistor Q2.

The first input terminal MST, the second input terminal MGT, the first output terminal MO1, the second output terminal MO2, and the first to fourth control terminals MT1 to MT4 shown in FIG. 7 each correspond to any of the terminals MT shown in FIGS. 4 to 6. FIG. 7 does not show a module sealing member MK.

For example, the first input terminal (power supply terminal) MST and the second input terminal (ground terminal) MGT are connected to the output (power supply side output and ground side output) of the smoothing capacitor C shown in FIG. 3 via the wiring line 10cb of the wiring board 10 and the electrode 10M.

This enables the voltage to be supplied from the smoothing capacitor C to the first input terminal MST and the second input terminal MGT.

The first output terminal MO1 and the second output terminal MO2 are connected to the input of the reactor R shown in FIG. 3 via the wiring line 10Ra of the wiring board 10.

This enables the voltage converted by the semiconductor device M to be supplied to the reactor R.

The control unit CON inputs and outputs a control signal that is inputted to the first to fourth control terminals MT1 to MT4 via the wiring line 10b of the wiring board 10 shown in FIG. 3.

In this manner, the control unit CON controls the operation of the semiconductor device M by inputting and outputting the control signal to be inputted to the semiconductor device M.

The module substrate MB shown in FIG. 7 is, for example, a resin substrate, on the lower surface of which a heat releasing plate is disposed.

The first input wiring line MSL is disposed on the top surface of the module substrate MB as shown in FIG. 7, for example.

The first input wiring line MSL includes a first portion MSL1 that extends along a first side 31 (longitudinal direction D1) of the module substrate MB, and a second portion MSL2 that extends along a second side 32 (lateral direction D2). The second side 32 is adjacent to the first side 31 and one end of the second side 32 is connected to one end of the first portion MSL1.

The other end of the second portion MSL2 of the first input wiring line MSL is near the intersection of the second side 32 and a fourth side 34 of the module substrate MB as shown in FIG. 7.

Furthermore, in the example of FIG. 7, the direction (longitudinal direction D1) along which the first portion MSL1 of the first input wiring line MSL extends is perpendicular to the direction (lateral direction D2) along which the second portion MSL2.

Thus, the first input wiring line MSL has an L-shape.

The width of the first portion MSL1 of the first input wiring line MSL is set to be greater than the width of the second portion MSL2 of the first input wiring line MSL.

In particular, the width of the first input wiring line MSL of the module substrate MB is set to be greater than the width of the wiring line of the wiring board 10 disposed above the module substrate MB.

In this manner, the semiconductor device M may deal with a large current although the wiring line area of the wiring board is reduced. This in turn lead to the reduction in size of the power converting device 100.

The first input terminal MST is disposed on the other side of the second portion MSL2, as shown in FIG. 7. The first input terminal MST is electrically connected to the first input wiring line MSL.

The first transistor MH1 is disposed on the first portion MSL1 so as to be near the one end of the first portion MSL1.

The first transistors MH1, MH1 is a first high-side transistor (MOS transistor) having a drain that is electrically connected to the first input wiring line (power supply wiring line) MSL via a bonding wire, for example, a source that is connected to the first power wiring line MM1 via a bonding wire, for example, and a gate G1, which is a control electrode, electrically connected to the first control wiring line MC1, as shown in FIG. 7.

The first control wiring line MC1 is disposed on the top surface of the module substrate MB. One end of the first control wiring line MC1 is connected to the control electrode (gate) G1 of the first transistor MH1 via a bonding wire, for example.

The first control terminal MT1 is disposed on the other end of the first control wiring line MC1 so as to be closer to the second side 32 than the first transistor MH1. The first control terminal 35 MT1 is electrically connected to the first control wiring line MC1.

In the example shown in FIG. 7, two first transistors MH1 are arranged in parallel on the one end of the first portion MSL1.

The second transistor MH2 is arranged on the other end of the first portion MSL1.

As shown in FIG. 7, for example, the second transistor MH2 is a second high-side transistor (MOS transistor) having a drain that is electrically connected to the first input wiring line (power supply wiring line) MSL, a source that is electrically connected to the second power wiring line MM2 via a bonding wire, for example, and a gate, which is a control electrode, electrically connected to the second control wiring line MC2 via a bonding wire, for example.

The second control wiring line MC2 is disposed on the top surface of the module substrate MB. The second control wiring line MC2 has one end that is connected to the control electrode (gate) G2 of the second transistor MH2 via a bonding wire, for example.

The second control terminal MT2 is disposed on the other end of the second control wiring line MC2 so as to be closer to a third side 33 than the second transistor MH2. The second control terminal MT2 is electrically connected to the second control wiring line MC2.

In the example of FIG. 7, two second transistors MH2 are arranged in parallel on the other end of the first portion MSL1.

The first power wiring line MM1 is disposed in a first substrate region N1 that is closer to the central region of the top surface of the module substrate MB than the first input wiring line MSL, and adjacent to the one end of the first portion MSL1 and the second portion MSL2 of the first input wiring line MSL.

The second power wiring line MM2 is disposed in a second substrate region N2 that is closer to the central region of the top surface of the module substrate MB than the first input wiring line MSL, and adjacent to the first substrate region N1 on a side close to the third side 33, which is opposite to the second side 32.

The third transistor ML1 is disposed on the first power wiring line MM1.

The third transistors ML1, ML1 is a first low-side transistor (MOS transistor) having a drain that is electrically connected to the first power wiring line MM1, a source that is electrically connected to the second input wiring line (ground wiring line) MGL via a bonding wire, the third power wiring line MGL1, and the first resistor Q1, for example, and a gate G3, which is a control electrode, electrically connected to the third control wiring line MC3 via a bonding wire, for example.

The third control wiring line MC3 is disposed on the top surface of the module substrate MB. The third control wiring line MC3 has one end that is connected to the control electrode G3 of the third transistor ML1 via a bonding wire, for example.

The third control terminal MT3 is disposed on the other end of the third control wiring line MC3 so as to be closer to the second side J2 than the third transistor ML1. The third control terminal MT3 is electrically connected to the third control wiring line MC3.

As described above, the first resistor Q1 electrically connects the second input wiring line (ground wiring line) MGL and the third power wiring line MGL1. The source of the third transistor ML1 is electrically connected to the second input wiring line (ground wiring line) MGL via the third power wiring line MGL1 and the first resistor Q1.

The third power wiring line MGL1 is disposed on the top surface of the module substrate MB. The third power wiring line MGL1 is adjacent to the second input wiring line (ground wiring line) MGL of the module substrate MB on the side of the second side J2.

In the example of FIG. 7, two third transistors ML1 are arranged in parallel on the first power wiring line MM1.

The fourth transistor ML2 is disposed on the second power wiring line MM2.

The fourth transistor ML2 is, for example, a second low-side transistor (MOS transistor) having a drain that is electrically connected to the second power wiring line MM2, a source that is electrically connected to the second input wiring line (ground wiring line) MGL via a bonding wire, the fourth power wiring line MGL2, and the second resistor Q2, for example, and a gate G4, which is a control electrode, electrically connected to the fourth control wiring line MC4 via a bonding wire, for example, as shown in FIG. 7.

The fourth control wiring line MC4 is disposed on the top surface of the module substrate MB. The fourth control wiring line MC4 has one end that is connected to the control electrode G4 of the fourth transistor ML2 via a bonding wire, for example.

The fourth control terminal MT4 is disposed on the other end of the fourth control wiring line MC4 so as to be closer to the third side 33 than the fourth transistor ML2, and electrically connected to the fourth control wiring line MC4.

As described above, the second resistor Q2 electrically connects the second input wiring line (ground wiring line) MGL and the fourth power wiring line MGL2. The source of the fourth transistor ML2 is electrically connected to the second input wiring line (ground wiring line) MGL via the fourth power wiring line MGL2 and the second resistor Q2.

The fourth power wiring line MGL2 is disposed on the top surface of the module substrate MB. The fourth power wiring line MGL2 is arranged to be adjacent to the second input wiring line (ground wiring line) MGL on the side of the third side 33 of the module substrate MB.

In the example of FIG. 7, two fourth transistors ML2 are arranged in parallel on the second power wiring line MM2.

The first control terminal MC1 and the third control terminal MC3 are arranged along the second portion MSL2 of the first input wiring line MSL, as shown in FIG. 7, for example.

The second control terminal MC2 and the fourth control terminal MC4 are arranged along the third side 33 of the module substrate MB, as show in FIG. 7, for example.

The first output terminal MO1 is disposed on the first power wiring line MM1. The first output terminal MO1 is electrically connected to the first power wiring line MM1.

The second output terminal MO2 is disposed on the second power wiring line MM2. The second output terminal MO2 is electrically connected to the second power wiring line MM2.

The first output terminal MO1 and the second output terminal MO2 are arranged to be close to each other in a direction along the first side 31 (longitudinal direction D1).

The second input wiring line MGL is disposed on the top surface of the module substrate MB, as shown in FIG. 7, for example. The second input wiring line MGL is disposed near the fourth side 34 that is opposite to the first side 31 and adjacnet to the second side 32 of the module substrate MB.

The second input wiring line (ground wiring line) MGL is disposed near a central portion of the fourth side 34 of the module substrate MB, as shown in FIG. 7, for example.

The second input terminal MGT is disposed on the second input wiring line MGL. The second input terminal MGT is electrically connected to the second input wiring line MGL.

Thus, in the semiconductor device M, the first to fourth transistors MH1, MH2, ML1, and ML2 are disposed to be close to one another.

In the semiconductor device M, the first input wiring line MSL has an L shape including the first portion MSL1 that is along the first side 31 (longitudinal direction D1) of the module substrate MB and the second portion MSL2 that is along the second side 32 (lateral direction D2), and the first input terminal (power supply terminal) MST and the second input terminal (ground terminal) MGT that are electrically connected to the output of the smoothing capacitor C are disposed on one side (near the fourth side 34) of the module substrate MB, and the first output terminal MO1 and the second output terminal MO2 that are electrically connected to the input of the reactor R are disposed near the central region of the module substrate MB.

The first control terminal MC1 and the third control terminal MC3, to which the control signal outputted from the control unit CON is inputted, are disposed along the second portion MSL2 of the first input wiring line MSL, as shown in FIG. 7, for example.

Furthermore, the second control terminal MC2 and the fourth control terminal MC4, to which the control signal outputted from the control unit CON is inputted, are disposed along the third side 33 of the module substrate MB, as shown in FIG. 7, for example.

This enables the reduction in size of the semiconductor device M while the current path for input and output is optimized.

Example 2

Figure 8:
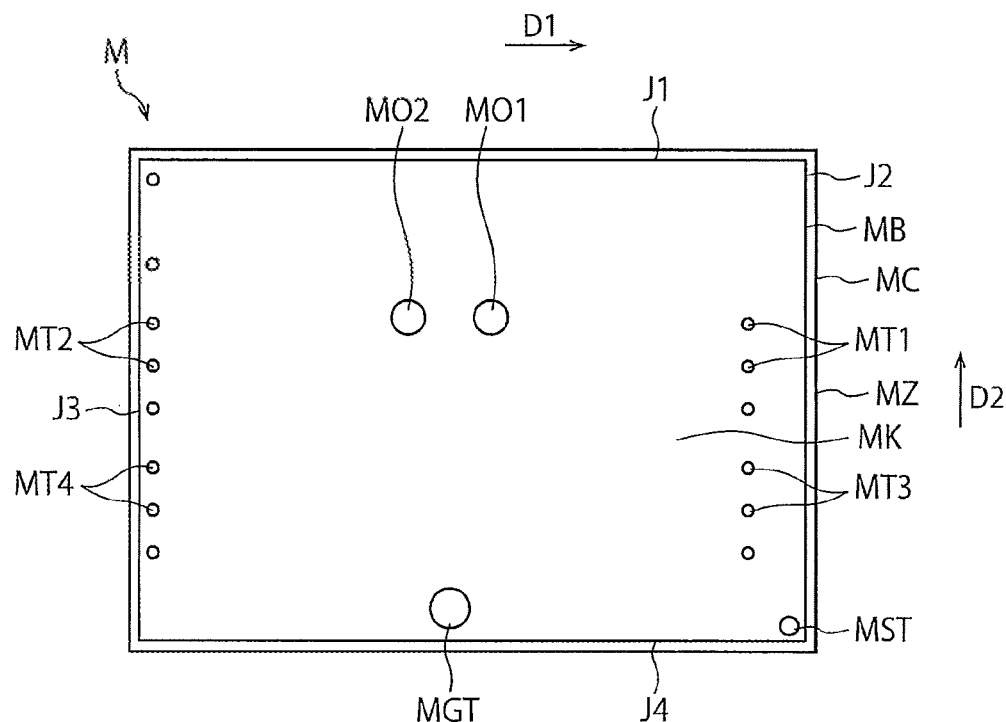
FIG. 8 is a top view illustrating another example of the configuration of the semiconductor device M.

An example of a configuration of Example 2 of the semiconductor device M will be described with reference to FIG. 8. In FIG. 8, the module sealing member MK is illustrated. Although the configuration of the semiconductor device M on the module substrate MB shown in FIG. 7 is not illustrated in FIG. 8, the configuration is the same as that of Example 1.

For example, as shown in FIG. 8, the semiconductor device M further includes the module sealing member MK and a module casing MZ.

The module sealing member MK seals the top surface of the module substrate MB together with the first input wiring line MSL, the first input terminal MST, the second input wiring line MGL, the second input terminal MGT, the first output terminal MO1, the second output terminal MO2, the first transistor MH1, the second transistor MH2, the third transistor ML1, the fourth transistor ML2, the first power wiring line MM1, the second power wiring line MM2, the third power wiring line MGL1, the fourth power wiring line MGL2, the first control wiring line MC1, the second control wiring line MC2, the third control wiring line MC3, the fourth control wiring line MC4, the first control terminal MT1, the second control terminal MT2, the third control terminal MT3, the fourth control terminal MT4, the first resistor Q1, and the second resistor Q2 shown in FIG. 7.

The module casing MZ is configured to surround the module substrate MB, as shown in FIG. 8, for example. This improves the insulation property of the semiconductor device M more reliably.

The semiconductor device M according to this example also reduces the size while optimizing the current path for input and output.

The module casing MZ may be omitted if necessary.

The configuration of the semiconductor device M is the same as the first and second embodiments.

As described above, the semiconductor device according to the present invention is a semiconductor device configured to convert an inputted voltage and output a converted voltage, including a module substrate MB, a first input wiring line (power supply wiring line) MSL disposed on a top surface of the module substrate MB and including a first portion MSL1 that extends along a first side 31 (longitudinal direction D1) of the module substrate MB and a second portion MSL2 that extends along a second side 32 (lateral direction D2), which is adjacent to the first side 31, the second portion having one end that is connected to one end of the first portion MSL1, a first input terminal (power supply terminal) MST disposed on another end of the second portion MSL2 and electrically connected to the first input wiring line MSL, a first transistor MH1 disposed on the first portion MSL1 so as to be on a side of the one end of the first portion MSL1, a second transistor MH2 disposed on the first portion MSL1 so as to be on side of another end of the first portion MSL1, a first power wiring line MM1 disposed in a first substrate region that is closer to a central region of the top surface of the module substrate MB than the first input wiring line MSL, the first power wiring line being adjacent to the one end of the first portion MSL1 and the second portion MSL2 of the first input wiring line MSL, a second power wiring line MM2 disposed in a second substrate region that is closer to the central region on the top surface of the module substrate MB than the first input wiring line MSL, the second power wiring line being adjacent to the first substrate region on a side of a third side 33 that is opposite to the second side 32, a third transistor ML1 disposed on the first power wiring line, a fourth transistor ML2 disposed on the second power wiring line, a first output terminal MO1 disposed on the first power wiring line and electrically connected to the first power wiring line, a second output terminal MO2 disposed on the second power wiring line and electrically connected to the second power wiring line, a second input wiring line (ground wiring line) MGL disposed on the top surface of the module substrate MB so as to be close to a fourth side 34 that is opposite to the first side 31 and adjacent to the second side 32 of the module substrate MB, a second input terminal (ground terminal) MGT disposed on the second input wiring line MGL and electrically connected to the second input wiring line MGL, and a module sealing member MK configured to seal the top surface of the module substrate MB.

Thus, the first to fourth transistors MH1, MH2, ML1, and ML2 are arranged to be close to one another in the semiconductor device according to the present invention.

In the semiconductor device M, the first input wiring line MSL has an L shape including the first portion MSL1 that is along the first side 31 (longitudinal direction D1) of the module substrate MB and the second portion MSL2 that is along the second side 32 (lateral direction D2), the first input terminal (power supply terminal) MST and the second input terminal (ground terminal) MGT are arranged on one side (near the fourth side J4) of the module substrate MB, and the first output terminal MO1 and the second output terminal MO2 are arranged to be in the central region on the surface of the module substrate MB.

This enables the reduction in size of the semiconductor device according to the present invention while the current path for input and output is optimized.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: power converting device
1000: power generating system
E: engine
X: fan
A, B: airflow
H: housing case
Z: heat radiation fin
11: first sealing member
10: wiring board
TIN: input terminal TOUT: output terminal
Y: first electronic component (rectifying circuit, rectification module)
M: second electronic component (bridge circuit, semiconductor device)
R: third electronic component (reactor)
W: fourth electronic component
C: smoothing capacitor
FX: LC filter
F: noise filter
CON: control unit
C1F, C2F: capacitor
10Ya, 10Ca, 10Cb, 10Ra, 10Rb, 10Fa, 10a, 10b: wiring line
10Y, 10M, 10R, 10F: electrode

The invention claimed is:

1. A semiconductor device configured to convert an inputted voltage and output a converted voltage, comprising:
a module substrate;
a first input wiring line disposed on a top surface of the module substrate and including a first portion that extends along a first side of the module substrate and a second portion that extends along a second side, which is adjacent to the first side, the second portion having one end that is connected to one end of the first portion;
a first input terminal disposed on another end of the second portion and electrically connected to the first input wiring line;
a first transistor disposed on the first portion so as to be on a side of the one end of the first portion;
a second transistor disposed on the first portion so as to be on a side of another end of the first portion;
a first power wiring line disposed in a first substrate region that is closer to a central region of the top surface of the module substrate than the first input wiring line, the first power wiring line being adjacent to the one end of the first portion and the second portion of the first input wiring line;
a second power wiring line disposed in a second substrate region that is closer to the central region on the top surface of the module substrate than the first input wiring line, the second power wiring line being adjacent to the first substrate region on a side of a third side that is opposite to the second side;
a third transistor disposed on the first power wiring line;
a fourth transistor disposed on the second power wiring line;
a first output terminal disposed on the first power wiring line and electrically connected to the first power wiring line;
a second output terminal disposed on the second power wiring line and electrically connected to the second power wiring line;
a second input wiring line disposed on the top surface of the module substrate so as to be close to a fourth side that is opposite to the first side and adjacent to the second side of the module substrate;
a second input terminal disposed on the second input wiring line and electrically connected to the second input wiring line;
a module sealing member configured to seal the top surface of the module substrate;
a first control wiring line disposed on the top surface of the module substrate, and having one end that is connected to a control electrode of the first transistor;
a second control wiring line disposed on the top surface of the module substrate, and having one end that is connected to a control electrode of the second transistor;
a first control terminal disposed on another end of the first control wiring line so as to be closer to the second side than the first transistor, and electrically connected to the first control wiring line; and
a second control terminal disposed on another end of the second control wiring line so as to be closer to the third side than the second transistor, and electrically connected to the second control wiring line.

2. The semiconductor device according to claim 1, further comprising:
a third control wiring line disposed on the top surface of the module substrate, and having one end that is connected to a control electrode of the third transistor;
a fourth control wiring line disposed on the top surface of the module substrate, and having one end that is connected to a control electrode of the fourth transistor;
a third control terminal disposed on another end of the third control wiring line so as to be closer to the second side than the third transistor, and electrically connected to the third control wiring line; and
a fourth control terminal disposed on another end of the fourth control wiring line so as to be closer to the third side than the fourth transistor, and electrically connected to the fourth control wiring line.

3. The semiconductor device according to claim 2, wherein the other end of the second portion of the first input wiring line is close to an intersection of the second side and the fourth side of the module substrate.

4. The semiconductor device according to claim 3, wherein the first output terminal and the second output terminal are arranged to be close to each other in a direction along the first side.

5. The semiconductor device according to claim 2, wherein:
the first control terminal and the third control terminal are arranged along the second portion of the first input wiring line; and
the second control terminal and the fourth control terminal are arranged along the third side of the module substrate.

6. The semiconductor device according to claim 3, wherein a width of the first portion of the first input wiring line is greater than a width of the second portion of the first input wiring line.

7. The semiconductor device according to claim 6, wherein a width of the first input wiring line of the module substrate is greater than a width of a wiring line of a wiring board that is disposed above the module substrate.

8. The semiconductor device according to claim 6, wherein the second input wiring line is disposed to be close to a central portion of the fourth side of the module substrate.

9. The semiconductor device according to claim 1, wherein the first input wiring line has an L shape.

10. The semiconductor device according to claim 2, wherein:
the first transistor is a first high-side transistor having a drain that is electrically connected to the first input wiring line, a source that is electrically connected to the first power wiring line, and a gate, which is a control electrode, electrically connected to the first control wiring line;
the second transistor is a second high-side transistor having a drain that is electrically connected to the first input wiring line, a source that is electrically connected to the second power wiring line, and a gate, which is a control electrode, electrically connected to the second control wiring line;

the third transistor is a first low-side transistor having a drain that is electrically connected to the first power wiring line, a source that is electrically connected to the second input wiring line, and a gate, which is a control electrode, electrically connected to the third control wiring line; and the fourth transistor is a second low-side transistor having a drain that is electrically connected to the second power wiring line, a source that is electrically connected to the second input wiring line, and a gate, which is a control electrode, electrically connected to the fourth control wiring line.

11. The semiconductor device according to claim 1, further comprising a module casing surrounding the module substrate.

12. The semiconductor device according to claim 9, wherein a direction along which the first portion of the first input wiring line extends is perpendicular to a direction along which the second portion extends.

13. The semiconductor device according to claim 10, further comprising:
a third power wiring line disposed on the top surface of the module substrate to be adjacent to the second input wiring line on a side of the second side of the module substrate;
a fourth power wiring line disposed on the top surface of the module substrate to be adjacent to the second input wiring line on a side of the third side of the module substrate;
a first resistor electrically connecting the second input wiring line and the third power wiring line; and
a second resistor electrically connecting the second input wiring line and the fourth power wiring line,
wherein the source of the third transistor is electrically connected to the second input wiring line via the third power wiring line and the first resistor, and
wherein the source of the fourth transistor is electrically connected to the second input wiring line via the fourth power wiring line and the second resistor.

14. A power converting device configured to convert an input voltage and output a converted output voltage, comprising:
a housing case having a first surface and a second surface that is opposite to the first surface;
a wiring board disposed in the housing case, and having a third surface that faces the first surface of the housing case and a fourth surface that is opposite to the third surface;
a rectification module disposed in a first case region on the first surface of the housing case, electrically connected to the wiring board, and rectifying the input voltage to output a rectified voltage;
a semiconductor device disposed in a second case region on the first surface of the housing case so as to be adjacent to the rectification module, electrically connected to the wiring board, and converting the rectified voltage that is rectified by the rectification module to output a converted voltage;
a reactor disposed in a third region on the first surface of the housing case so as to be adjacent to the semiconductor device, electrically connected to the wiring board, and adjusting the converted voltage outputted from the semiconductor device to output an adjusted voltage;
a control unit disposed on the fourth surface of the wiring board, and controlling operations of the rectification module and the semiconductor device;
a smoothing capacitor disposed on the fourth surface of the wiring board, connected to an output of the rectification module via a wiring line of the wiring board, and smoothing the rectified voltage outputted from the rectification module;
a noise filter disposed on the fourth surface of the wiring board, connected to an output of an LC filter including the reactor via a wiring line of the wiring board, and filtering a voltage outputted from the LC filter to output a filtered voltage; and
a first sealing member sealing the rectification module, the semiconductor device, and the reactor on the first surface of the housing case, and also sealing the wiring board and the control unit, the smoothing capacitor, and the noise filter on the fourth surface of the wiring board,
wherein the semiconductor device includes:
a module substrate;
a first input wiring line disposed on a top surface of the module substrate and including a first portion that extends along a first side of the module substrate and a second portion that extends along a second side, which is adjacent to the first side, the second portion having one end that is connected to one end of the first portion;
a first input terminal disposed on another end of the second portion and electrically connected to the first input wiring line;
a first transistor disposed on the first portion so as to be on a side of the one end of the first portion;
a second transistor disposed on the first portion so as to be on a side of another end of the first portion;
a first power wiring line disposed in a first substrate region that is closer to a central region of the top surface of the module substrate than the first input wiring line, the first power wiring line being adjacent to the one end of the first portion and the second portion of the first input wiring line;
a second power wiring line disposed in a second substrate region that is closer to the central region on the top surface of the module substrate than the first input wiring line, the second power wiring line being adjacent to the first substrate region on a side of a third side that is opposite to the second side;
a third transistor disposed on the first power wiring line;
a fourth transistor disposed on the second power wiring line;
a first output terminal disposed on the first power wiring line and electrically connected to the first power wiring line;
a second output terminal disposed on the second power wiring line and electrically connected to the second power wiring line;
a second input wiring line disposed on the top surface of the module substrate so as to be close to a fourth side that is opposite to the first side and adjacent to the second side of the module substrate;
a second input terminal disposed on the second input wiring line and electrically connected to the second input wiring line;
a module sealing member configured to seal the top surface of the module substrate;

a first control wiring line disposed on the top surface of the module substrate, and having one end that is connected to a control electrode of the first transistor;

a second control wiring line disposed on the top surface of the module substrate, and having one end that is connected to a control electrode of the second transistor;

a first control terminal disposed on another end of the first control wiring line so as to be closer to the second side than the first transistor, and electrically connected to the first control wiring line; and a second control terminal disposed on another end of the second control wiring line so as to be closer to the third side than the second transistor, and electrically connected to the second control wiring line.

* * * * *